United States Patent [19]

Leehan et al.

[11] 4,006,469

[45] Feb. 1, 1977

[54] DATA STORAGE CELL WITH TRANSISTORS OPERATING AT DIFFERENT THRESHOLD VOLTAGES

[75] Inventors: Gerald W. Leehan, Centreville, Va.; Sylvester F. Miniter, III, Wheaton, Md.; Augustus J. Sassa, Manassas, Va.

[73] Assignee: International Business Machines Corporation, Armonk, N.Y.

[22] Filed: Dec. 16, 1975

[21] Appl. No.: 641,328

[52] U.S. Cl. .................... 340/173 R; 340/173 FF; 307/238; 307/279
[51] Int. Cl.² ...................................... G11C 11/40
[58] Field of Search ................. 340/173 R, 173 FF; 307/238, 279

[56] References Cited

UNITED STATES PATENTS

| | | | |
|---|---|---|---|
| 3,949,382 | 4/1976 | Yasui | 340/173 R |
| 3,959,781 | 5/1976 | Mehta | 340/173 R |

*Primary Examiner*—Terrell W. Fears
*Attorney, Agent, or Firm*—Joseph C. Redmond, Jr.

[57] ABSTRACT

A semiconductor memory or storage circuit includes cross coupled transistors and isolating transistors operating at a first threshold voltage and load transistors for the cross coupled transistors operating at a second threshold voltage. The storage cell is disposed in a matrix of word and bit lines. The load devices are connected between a supply voltage and the cross coupled transistors which are returned to a reference potential. The isolating transistors are connected between the cross coupled transistors and adjacent bit lines. The word line is connected to the gates of both the isolating transistors and the load devices. When the word line is down, the isolating transistors are turned off and the load devices supply sufficient current to retain the stored information in the cross coupled transistors. When the word line is raised, the gate voltage of the load transistors is raised to supply additional current to the circuit. Simultaneously, the isolating transistors connect the circuit to the bit lines for Read/Write modes of operation. The invention achieves cell powering without a pulse power gate terminal. Also, the invention does not require a special deselect potential to keep current in the circuit during the storage mode.

15 Claims, 8 Drawing Figures

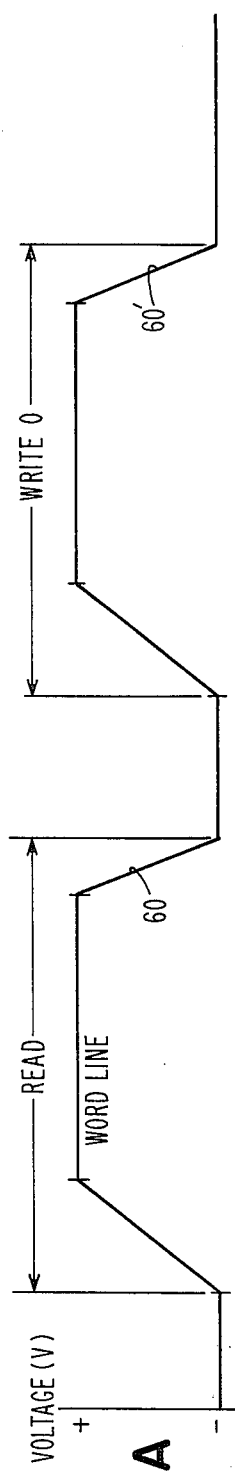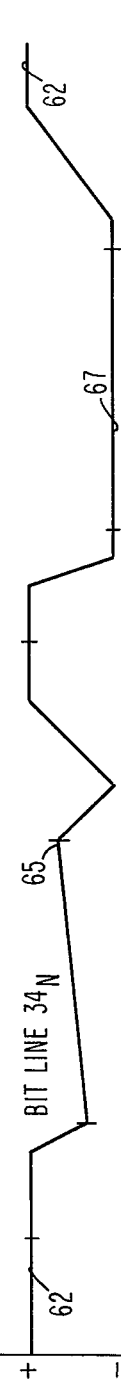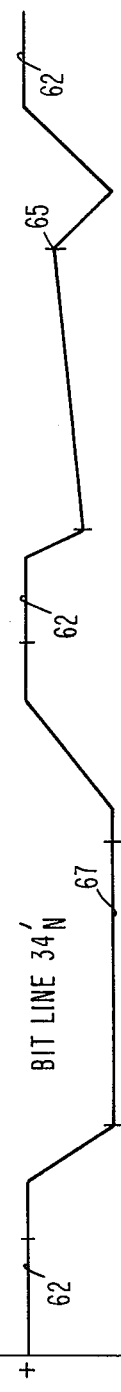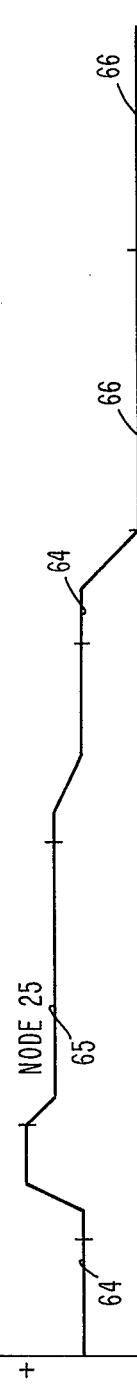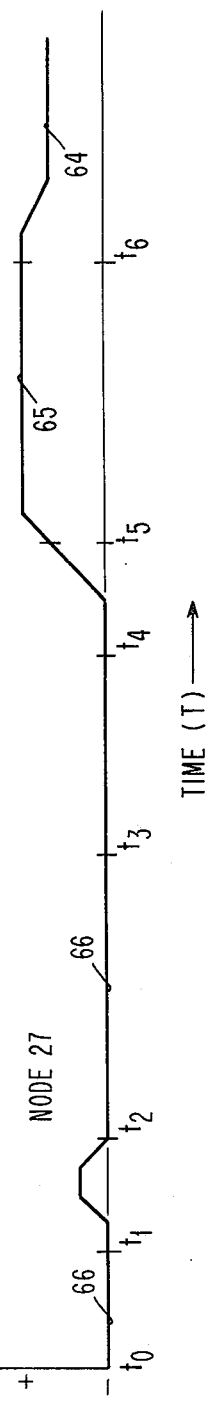
FIG. 3A
FIG. 3B
FIG. 3C
FIG. 3D
FIG. 3E

DATA STORAGE CELL WITH TRANSISTORS OPERATING AT DIFFERENT THRESHOLD VOLTAGES

CROSS-REFERENCES TO RELATED APPLICATIONS

Commonly assigned copending applications having Ser. No. 583,926, filed on June 5, 1975 by L. B. Freeman et al., entitled "Enhancement-And Depletion-Type Field Effect Transistors Connected in Parallel" and Ser. No. 592,148, filed June 30, 1975 by G. Sonoda, entitled "Static Four Device Cell."

BACKGROUND OF THE INVENTION

A. Field of the Invention

The invention relates to semiconductor circuits and devices. More particularly, the invention relates to low powered semiconductor storage circuits and memories.

B. Description of the Prior Art

Semiconductor memory circuits of the type described in U.S. Pat. No. 3,560,764 issued Feb. 2, 1971 and assigned to the present assignee save power but are burdened by (1) drivers for power gating terminals as well as bit and word lines, (2) different driver voltage levels for operating isolating and load transistors, and (3) additional wiring to support the voltage distribution lines for operating the isolating and load transistors which reduces storage area in a chip. As semiconductor memory density requirements increase, it is desirable to further lower power requirements, decrease circuit area and simplify operation to achieve memory performance suitable for operation with high performance data processing systems.

An object of the invention is a storage circuit that permits the fabrication of high density random access memories.

Another object is a random access memory that is powered without the use of a power gating terminal.

Another object is a random access memory that does not require a special deselect potential for each storage circuit.

Still another object is a memory that has low power requirements by the absence of power gating drivers and accompanying wiring.

In an illustrative embodiment of the invention, a memory storage circuit includes first and second sets of transistors, one set of transistors serving as storage devices and the other set serving as load devices for the storage devices. The storage and load devices operate at different threshold voltages. In one form, the storage devices are of the enhancement type either N or P channel while the load devices are of the depletion type, either N or P type. The storage devices are cross coupled between their respective drain and gate terminals. Each load device is coupled to a different cross coupled transistor. The load devices are also connected to a common voltage supply, the return to the voltage supply being through the cross coupled transistors. An isolating transistor of the first type is connected to each cross coupled transistor. The storage circuit is disposed in a matrix array of word and bit lines. The isolating transistors of the storage circuit are connected to adjacent bit lines in a column. A word line is connected to (a) the gate of all isolating transistors in the same row and (b) the gates of the load devices for the storage circuits in the row. In the storage condition of the circuit, the word line is at a first potential which places the isolating devices in a non-conducting condition and disconnects the cell from the bit lines. The threshold voltage for the load devices, however, is below the word line potential which permits them to supply current to the cross coupled cells from the power supply to retain the information stored in the circuit. The word line potential is changed to a second level for a READ operation. The isolating transistors are turned on by the word line potential to connect the storage cell to the bit lines. Also, the word line potential drives the load transistors further into conduction to supply the parasitic capacitance of the conducting transistor which otherwise would be charged by one bit line. The capacitance on the other bit line is discharged to ground through the conducting transistor. The potentials appearing on the bit lines are subtracted from each other in a differential or sense amplifier to give a resultant pulse indicative of the information state of the cell. To change the information state or WRITE into the storage cell, the word line is changed to the second level while the bit line potentials are changed in opposite directions according to the information state desired to be stored in the circuit. For a binary 1 state, the potentials on the bit lines turn on one and turn off the other storage transistor. One bit line potential charges the parasitic capacitance of one storage transistor to place it in a conducting condition. The other bit line potential discharges the parasitic capacitance of the other storage transistor to place it in a non-conducting condition. To write a binary 0 into the storage circuit, the word line potential is raised to the second level and the bit line potentials are reversed to turn off the conducting transistor and turn on the non-conducting transistor while discharging and charging the appropriate parasitic capacitances in the circuit.

A feature of the invention is a storage circuit including sets of transistors having different threshold operating voltages, in one form enhance and depletion transistors, to permit the cell to be charged without a power gating terminal.

Another feature is a storage circuit including depletion mode FET transistors as load devices that eliminates the need for word drivers to maintain a minimum deselect potential for a storage circuit.

Another feature is a storage circuit that limits power on a bit line to that necessary for reading and writing into a storage cell.

Another feature is a word line that simultaneously operates the isolating and load devices for operating a storage circuit in a store, read and write mode.

BRIEF DESCRIPTION OF THE DRAWING

These and other objects, features, and advantages of the invention will be more fully apprehended from the following detailed specification taken in conjunction with the appended drawing in which:

FIGS. 3A, 3B, 3C, 3D and 3E are timing diagrams for operating the memory of FIG. 1.

DESCRIPTION OF PREFERRED EMBODIMENT

Figure 1:
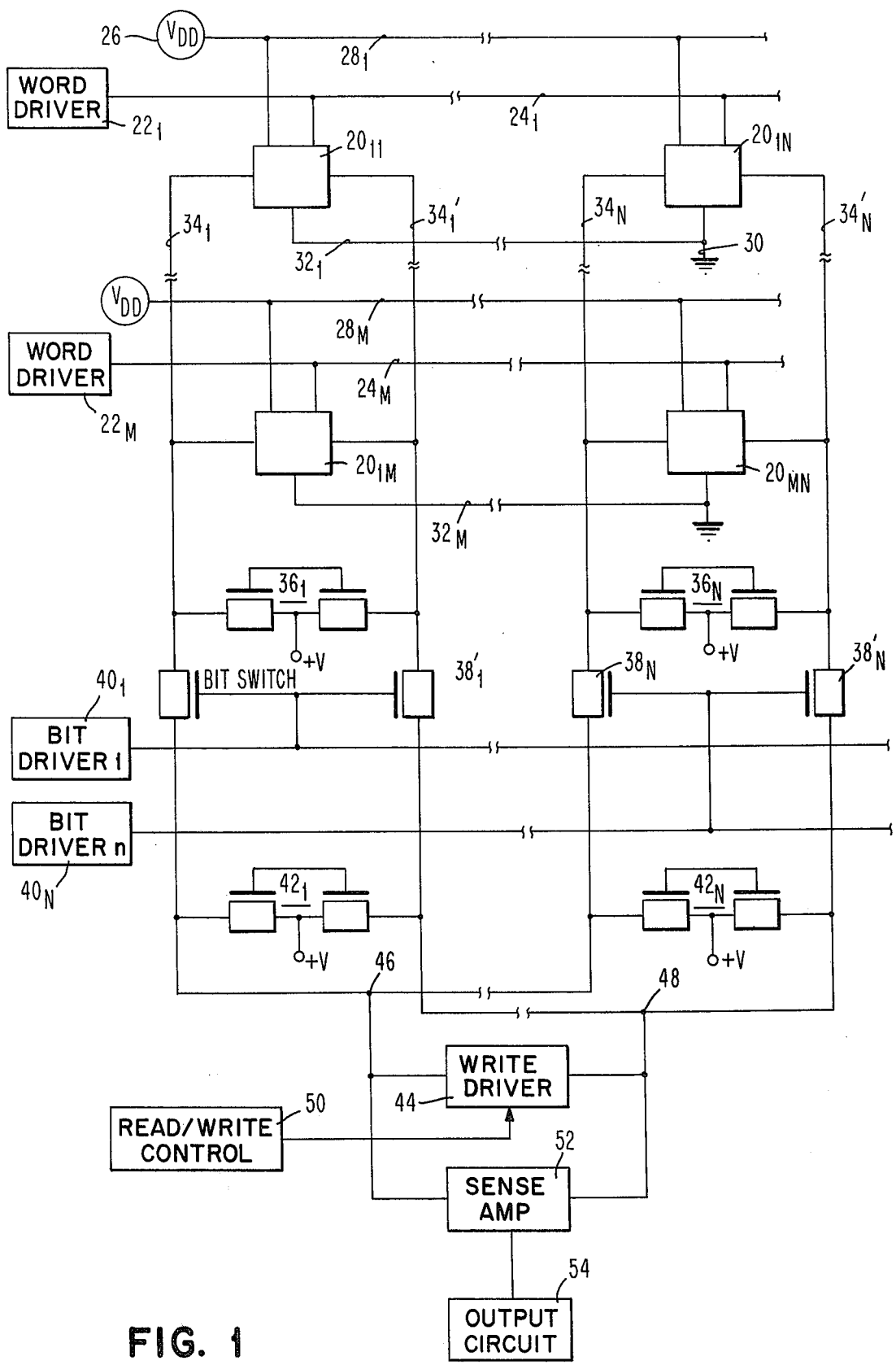
FIG. 1 is an electrical schematic of a memory employing the principles of the present invention.

In FIG. 1, a plurality of storage circuits 20 are arranged in a matrix of M rows and N columns. Each storage circuit in a row is connected to a word driver 22 through a word line 24. The storage circuits in a row are also connected to a supply voltage 26, typically $V_{DD}$ through a supply line 28. The storage circuits in a row are also connected to a reference potential 30, typically ground through a return line 32. The storage circuits in a column are connected to a pair of bit lines 34 and 34'. A precharge circuit 36 is coupled between the bit lines to maintain them at the same potential prior to a READ/WRITE operation. Bit line switches 38 and 38' are included in the lines 34 and 34', respectively. The bit line switches 38 and 38' are operated by a bit driver 40. A second set of precharge circuits 42 is coupled between each set of bit lines to maintain the lines at the same potential between the bit line switches 38 and 38' and a WRITE driver 44. All bit lines are coupled to the WRITE driver at nodes 46 and 48. The WRITE driver is operated by a READ/WRITE control switch 50. A sense amplifier 52 is connected to the nodes 46 and 48 to read the output from the selected storage circuit. An output circuit 54 receives the output from the sense amplifier 52.

Figure 2:
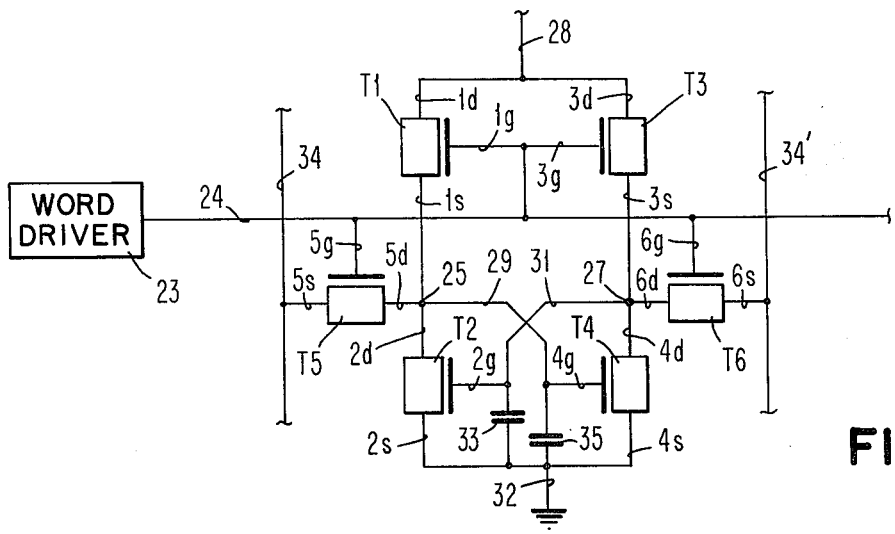
FIG. 2 is an electrical schematic of a storage circuit that is incorporated into the memory of FIG. 1.

FIG. 2 shows a pair of transistors T1 and T3 having drain (d), gate (g) and source (s) electrodes. The drain electrodes 1d and 3d are connected together and to the supply line 28. The gate electrodes 1g and 3g are connected together and to the word line 24. The source lines 1s and 3s are connected to storage devices T2 and T4, respectively. Each storage device includes a drain (d), gate (g) and source (s) electrodes. The drain electrodes 2d and 4d are connected to the source electrodes 1s and 3s, respectively. Each of the previously recited connections includes a node 25 and 27 for a connection 29 and 31 to the gate electrodes 4g and 2g, respectively. The source electrodes 2s and 4s are connected together and to the return line 32. Parasitic capacitances 33 and 35 are formed between each gate and source of the devices T2 and T4, respectively. Also included in each storage circuit is a set of isolating transistors T5 and T6. Each isolating transistor includes a drain (d), gate (g) and source (s) electrodes. The drain electrodes 5d and 6d are connected to the nodes 25 and 27, respectively. The source electrodes 5s and 6s are connected to the bit lines 34 and 34', respectively. The gate electrodes 5g and 6g are connected to the word line 24.

The transistors T1 and T3 operate at a lower turn on threshold than that for transistors T5 and T6. Normally, T1 and T3 are slightly conducting whereas T5 and T6 are non-conducting. The potential on the word line is adapted to achieve this conducting condition for the load and gating transistors. In the storage condition, either T2 or T4 is conducting while the other is non-conducting. This condition is achieved by operation of the bit lines as will be described hereinafter. With T2 non-conducting and T4 conducting, the capacitors 35 and 33 are charged and discharged, respectively. When T4 is conducting, the load device T1 maintains the charge on the parasitic capacitor 35. The capacitor 33 is discharged by reason of being shorted to ground through T4. The load current supplied by T3 passes through T4 to the return line 32. For purposes of description, this condition of the circuit with T2 non-conducting and T4 conducting will be defined as a binary 1 state. The opposite or binary 0 state is defined where T4 is non-conducting and T2 is conducting.

The operation of the memory will now be described in conjunction with (a) the memory/circuit configurations shown in FIGS. 1, 2 and (b) the timing diagrams shown in FIGS. 3A, 3B, 3C, 3D and 3E. At $t_0$ the potential on the bit lines $34_N$ and $34'_N$ is shown by the voltage level 62 in FIG. 3B and 3C. The potentials at the nodes 25 and 27 are shown by the voltage levels 64 and 66, respectively in FIGS. 3D and 3E which are indicative of the binary 1 state for the circuit $20_{MN}$.

For a READ operation the appropriate bit driver, for example $40_N$ is turned on at $t_1$ to close the bit line switches $38_N$ and $38'_N$. Simultaneously, the word line driver $22_M$ is turned on to provide a pulse 60 to the word line $24_M$, as shown in FIG. 3A. Isolating transistors T5 and T6 are turned on to connect the storage circuit $20_{MN}$ to the bit lines $34_N$ and $34'_N$. When the gating transistors T5 and T6 are turned on the potential 64 at the node 25 is approximately equal to or less than the potential 62 on the bit line $34_N$ whereas the potential 66 at the node 27 is substantially less than the potential 62 on the bit line $34'_N$. With the node 25 at or near the potential of the line $34_N$, the capacitor 35 normally would be charged from the bit line $34_N$. However, the word line $34_N$ raises the potential on the gate 1g to increase current flow through T1 to keep the capacitor 35 fully charged, negating the need for additional power from the bit line $34_N$. FIG. 3B shows the voltage level 62 initially drops after $t_1$, but then builds up to the level 63 as the transistor T1 conducts harder. The potential at node 25 rises toward the potential 62 on bit line $34_N$, as shown in FIG. 3D. At $t_2$ the potential at the node 25 drops off as the potential follows the bit line $34_N$ until T1 commences to conduct harder. As T1 conducts harder the potential at the node 25 stabilizes at the level 65 to which the bit line $34_N$ is rising.

After $t_1$, the potential on the bit line $34'_N$, commences to fall to the level 67, as shown in FIG. 3C since T3 and T4 are conducting. The higher potential 62 on the bit line $34'_N$ causes a slight rise in the potential at the node 27, as shown in FIG. 3E. As the potential on the bit line $34'_N$ reaches the level 67, the potential at the node 27 returns to the level 66 at $t_2$. Also T4 is turned on harder by T1 to clamp the node 27 at the level 66 and discharge any charge stored on the capacitor 33 during the rise in potential at the node 27 between $t_1$ and $t_2$.

Thus the sense amplifier 52 shown in FIG. 1 sees the up level 65 on $34_N$ and the down level 67 on $34'_N$ at $t_3$ indicative of a binary 1 state in the storage circuit $20_{MN}$. The nodes 25 and 27 are at the potentials 65 and 66 at $t_3$. For a binary 0 state in the storage circuit $20_{MN}$, the sense amplifier would see the down level or 66 on the bit line $34_N$ and the up level 65 on the bit line $34'_N$.

For a WRITE operation the read/write control switch 50 is operated to turn on the WRITE driver 44 shown in FIG. 1. To WRITE a binary 0 into the storage circuit $20_{MN}$, the WRITE driver 44 provides the down level 67 on the bit line $34_N$ and the up level or 62 on $34'_N$ at $t_4$, as shown in FIGS. 3B and 3C. Simultaneously, the wored driver 22M provides the pulse 60' and the bit drivers 40N are operated to connect the WRITE potentials 67 and 62 to the storage circuit $20_{MN}$. The down level or potential 67, shown in FIG. 3B, discharges the stored capacitor 35 causing the potential at the node 25 to fall from the potential 64 to the potential 66 at $t_5$. The potential on the bit line $34_N$ may rise slightly until T2 turns on hard and clamps the node 25 to the return line 32. Simultaneously, the potential 62 on the bit line $34'_N$ charges the capacitor 33 to turn on the transistor T2. The current from T1, previously flowing to the capacitor 35, is redirected through the transistor T2 to the return line 32. Simultaneously, the current previously flowing from transistor T3 through T4 to the return line 32 is redirected to the capacitor 33. Initially at $t_4$ the potential 62 on the bit line $34'_N$ falls toward the level 66 but then rises to the level 65 as current flows from T3 to the capacitor 33 and T4 turns off as the capacitor 35 is discharged. The potential at the node 27 increases to the level 65, as shown in FIG. 3E, at $t_5$. When the word line pulse 62 and bit line driver pulses (not shown) are terminated at $t_6$, the storage circuit $20_{MN}$ retains the nodes 25 and 27 at the levels 66 and 64, respectively. The node 27 falls from the potential level 65 to the level 64 as T6 disconnects the bit line $34'_N$ from the node. The potential on the bit line $34'_N$ initially falls as T5 disconnects the circuit $20_{MN}$ from the line, but rises as the precharge circuit $36_N$ returns the bit lines to the potential 62 for the next operation. To write a binary 1 into the storage circuit, the bit line potentials are reversed or raised on $34_N$ and lowered on $34'_N$. When the word and bit line drivers are operated the storage devices T2 and T4 are returned to the condition previously described.

Summarizing the word line driver connection controls the input power to the storage circuit during the active and passive state thereof. The load devices minimize the power requirements of the bit drivers by the former conducting during the active state of the storage circuit.

Figure 4:
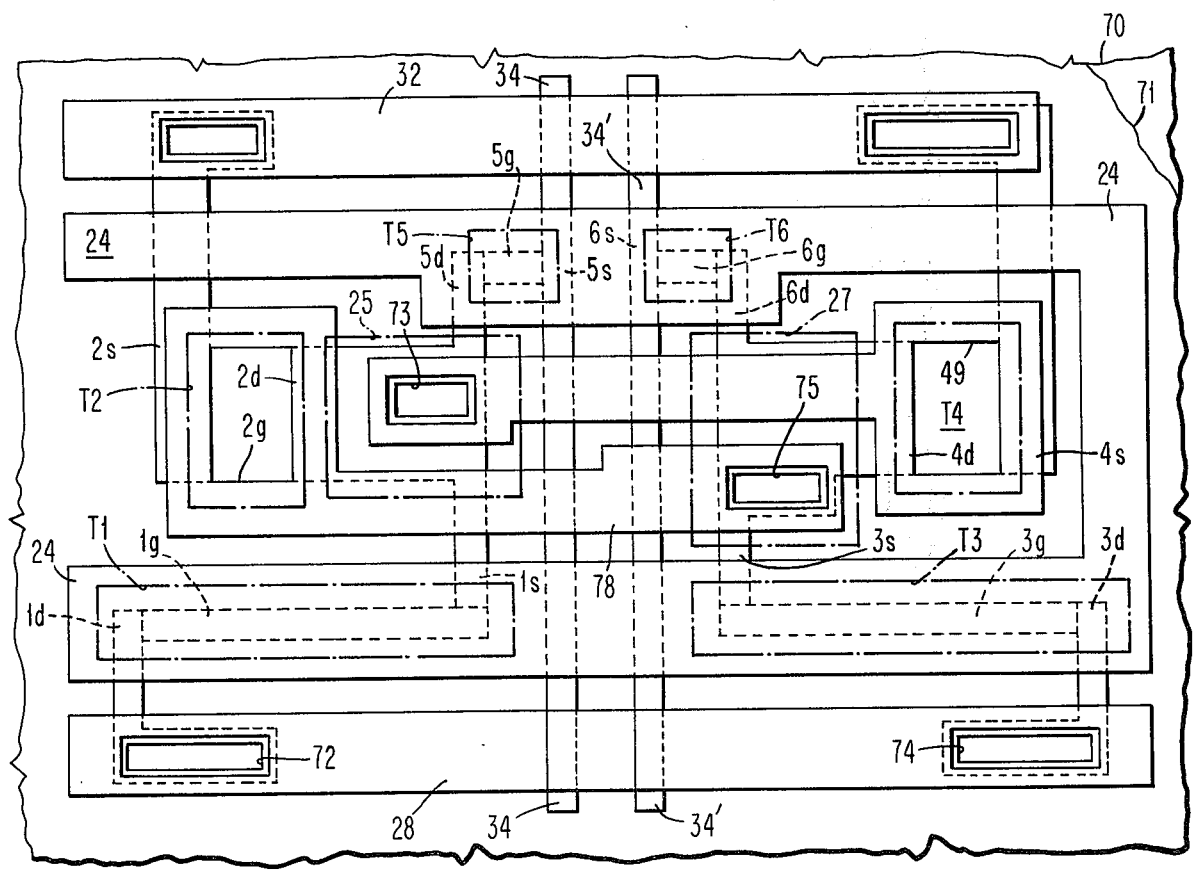
FIG. 4 is a plan view of a portion of a semiconductor substrate incorporating the circuit of FIG. 2.

FIG. 4 shows a storage circuit, e.g., $20_{MN}$ embodied in a semiconductor substrate 70. All of the devices T1 .. . T6 are formed in a semiconductor substrate by conventional diffusion technique, described for example in U.S. Pat. No. 3,508,209, assigned to the present assignee. An insulating layer 71, typically an oxide covers the substrate and electrically isolates the substrate from overlying metalization except where contact openings are made in the layer. Drain electrodes 1d and 3d are shown connected to a contact 72 and 74, respectively which unites with a supply line 28 adhered to the insulating layer 71 covering the substrate. Gate electrodes 1g and 3g extend between the drain electrodes 1d and 3d, and source electrodes 1s and 3s, respectively. The gate electrodes 1g and 3g connect to the word line 24 that resides on the insulating layer 71. The source electrodes 1s and 3s connect to common diffusion nodes 25 and 27. These nodes form the drain electrodes 2d, 5d and 4d, 6d. Source electrodes 2s and 4s together with gate electrodes 2g and 4g complete the devices T2 and T4. The common diffusion nodes 25 and 27 are connected through contacts 72 and 75, respectively to metal strips 76 and 78 which interconnect the drain and gate electrodes 2d/4g and 4d/2g, respectively. The source electrodes 2s and 4s are connected to a metal strip 32 that resides on the insulating layer 71 overlying the substrate 70. Completing the device are bit line diffusions 34 and 34' which also serves as the source diffusions 5s and 6s for the devices T5 and T6, respectively. The gate electrodes 5g and 6g are disposed between the source 34, 34' and drain electrodes 5g and 6g, respectively. The metal strip 24, previously described, also connects to electrodes 5g and 6g to complete the wiring for the storage circuit. The metal strips 28 and 32 are connected to appropriate terminals (not shown) at the edge of the semiconductor chip 70 for subsequent connection to appropriate supply and reference potentials. The metal strip 24 is also connected to an appropriate terminal (not shown) at the edge of the semiconductor chip 20 for subsequent connection to a appropriate word line driver. The bit line diffusion 34 and 34' are connected to appropriate terminals (not shown) on the surface of the semiconductor chip 70 for subsequent connection to the bit line switches 38 and 38', as shown in FIG. 1.

For field effect transistor technology, either N or P type, it is well known that enhancement and depletion type devices operate at different threshold voltages. Thus in the present instance, the devices T1 and T3 may be depletion devices while the devices T2, T4, T5 and T6 may be enhancement devices. Field effect devices with different threshold voltages may also be obtained by ion implantation techniques as described in U.S. Pat. No. 3,655,457 assigned to the present assignee. Differences in threshold voltages for the devices T1/T3 and T2/T6 may also be obtained by changing the thickness of gate oxide for the devices. Obviously, there are other technology and circuit alternatives that are available to cause the load and isolating/storage devices to operate at different threshold voltages. Also, it should be understood that the power supply, word line and other operating voltages for N type technology are of opposite polarity to the corresponding operating voltages for P type technology.

While the invention has been particularly shown and described with reference to the preferred embodiments thereof, it will be understood by those skilled in the art that the foregoing and other changes in form and details may be made therein without departing from the spirit and the scope of the invention.

What is claimed is:

1. A memory array comprising
   a. a matrix comprising M word lines and N bit lines or pairs of bit lines,
   b. a storage circuit between each intersecting word line and pair of bit lines,
   c. power supply means for each storage circuit,
   d. means for providing potentials to the word and bit lines, and
   e. means included in each storage circuit responsive to the word line potentials for controlling the input power to the storage circuit during the active and passive state thereof.

2. The memory array of claim 1 wherein the means responsive to the word line potentials are at least first and second transistors that operate at different threshold potentials.

3. The memory array of claim 2 wherein the first and second transistors are depletion and enhancement type, respectively.

4. The memory array of claim 3 wherein a first potential on the word line operates the depletion devices to supply power to the storage circuit and operates the enhancement devices to disconnect the storage circuit from the bit lines.

5. The memory array of claim 3 wherein a second potential on the word line increases conduction through the depletion devices and turns on the enhancement devices to connect the storage circuit to the bit lines.

6. The memory of claim 5 further including a precharge circuit connected between each pair of bit lines.

7. A memory circuit comprising
   a. a first and second load transistors that conduct at a first threshold voltage, b. third and fourth storage circuit transistors connected to the load transistors and conducting at a second threshold voltage,
c. the fifth and sixth isolating transistors connected to the load and storage circuits and conducting at the second threshold voltage,
d. and means for providing first and second threshold potentials to the load and isolating transistors for controlling the power to the storage transistors.

8. The memory circuit of claim 7 wherein the first potential places the load transistors in a conducting condition and the isolating transistors in a non-conducting condition.

9. The memory circuit of claim 7 wherein the second potential increase the conducting condition of the load transistors and places the isolating transistors in a conducting condition.

10. The memory circuit of claim 7 wherein the load transistors are depletion type including control electrodes and both the storage and isolating transistors are enhancement type including control electrodes.

11. The memory circuit of claim 10 wherein the means for providing potentials is connected to the control electrodes of the load and isolating transistors.

12. A memory circuit comprising
a. a pair of bit lines,
b. a word line,
c. power supply and return line terminals,
d. a set of depletion type devices connected at a first, second and third electrodes to a power supply, word line, and common node, respectively,
e. a first pair of enhancement devices having their first and second terminals cross coupled and connected to the common nodes and their third electrode connected to the return terminal, and
f. a second pair of enhancement type transistors having their first, second and third electrodes connected to the common node, word line and bit line.

13. The memory array of claim 1 wherein the storage circuit is defined by the memory circuit of claim 12.

14. A semiconductor device comprising
a. a semiconductor substrate,
b. first, second and third sets of transistors formed in the substrate in first and second groups,
c. diffusion rails formed in the substrate between the first and second groups and serving as bit lines connected to the third transistor in each group,
d. first metalization disposed on the substrate and connected to the first set of transistors for supplying power to the groups of transistors,
e. second metalization disposed on the substrate and connected to the second set of transistors as a power return for the groups of transistors,
f. third metalization disposed on the substrate for interconnecting the second set of devices as a storage circuit, and
g. fourth metalization disposed on the substrate and connected to the first and third sets of devices for controlling the power to the storage circuits and the connection of the third set of devices to the bit lines.

15. The semiconductor device of claim 14 wherein the first set of transistors are depletion mode field effect transistors and the second and third set of transistors are enhancement mode field effect transistors.

* * * * *